United States Patent [19]

Schnetzer

[11] Patent Number: 4,721,929

[45] Date of Patent: Jan. 26, 1988

[54] MULTI-STAGE POWER DIVIDER

[75] Inventor: Michel W. Schnetzer, Longmont, Colo.

[73] Assignee: Ball Corporation, Muncie, Ind.

[21] Appl. No.: 920,098

[22] Filed: Oct. 17, 1986

[51] Int. Cl.[4] .............................................. H03H 7/48
[52] U.S. Cl. ...................................... 333/127; 333/128
[58] Field of Search ............... 333/100, 124, 127, 128, 333/130, 136

[56] References Cited

U.S. PATENT DOCUMENTS

| | | | |
|---|---|---|---|
| 2,148,098 | 2/1939 | Bowman-Manifold | 178/44 |
| 2,244,756 | 6/1941 | Alford | 179/171.5 |
| 3,091,743 | 5/1963 | Wilkinson | 333/9 |
| 3,516,025 | 6/1970 | Podell | 333/11 |
| 3,904,990 | 9/1975 | LaRosa | 333/9 |
| 4,310,814 | 1/1982 | Bowman | 333/128 X |
| 4,639,694 | 1/1987 | Seino et al. | 333/128 |

OTHER PUBLICATIONS

Bailey, *A Simple Stripline Design for Uneven Power Split,* NASA Technical Memorandum 81870, Aug. 1980.

*Primary Examiner*—Paul Gensler
*Attorney, Agent, or Firm*—Gilbert E. Alberding

[57] ABSTRACT

A multi-stage power divider particularly adapted for use in microwave circuits consists of a plurality of transmission lines and resistances uniquely arranged to achieve a wide range of power division and to give the power divider broad bandwidth and high isolation. The power divider is particularly easy to design and manufacture in stripline and microstrip constructions. The divider provides coupling in the range of 3 dB to 20 dB with high isolation and in a single-layer construction.

11 Claims, 2 Drawing Figures

MULTI-STAGE POWER DIVIDER

BACKGROUND OF THE INVENTION

This invention relates generally to power dividers and, more particularly, to a multi-stage power divider for microwave circuits.

There are many applications in which it is desirable to divide a signal into a plurality of signals. In antenna systems, for example, it is often desirable to supply a portion of an input signal to each of a plurality of individual antenna units. Signal division may also be used in electronic circuitry to drive plural solid-state amplifiers with the same signal, in cable transmission systems to divide an original signal among a number of output cables, and in numerous other applications.

Coupled line dividers are often used in microwave applications for supplying power from an input port to a pair of output ports. Coupled line dividers, however, are not fully satisfactory because they require precise line gaps and spacings to achieve the desired power division, and often require line widths and gap spacings that are either too wide or too narrow.

Various other devices for accomplishing power division are known in the art, as shown by U.S. Pat. Nos. 2,148,098; 2,244,756; 3,091,743; 3,516,025; 3,904,990; and 4,556,856.

Such power dividers are not capable of providing a wide range of power division and a sufficiently broad bandwidth and isolation of their output ports for many microwave applications. In addition, such dividers are also costly to manufacture for microwave applications.

SUMMARY OF THE INVENTION

The present invention relates to a multistage power divider which consists of a plurality of radio frequency pathways and resistors that are uniquely connected to achieve power division and to give the device broad bandwidth and high isolation. The power divider of the invention is particularly designed for use in microwave circuits, and permits a simple, single layer stripline, or microstrip, construction to provide effective broad bandwidth power division and coupling in the range of 3 dB to 20 dB with high isolation.

In the power divider of this invention, a plurality of passive circuit elements are arranged to define a plurality of radio frequency pathways between a power input and a plurality of power outputs, and to divide incoming radio frequency power among the plurality of outputs in a preselected ratio. The passive circuit elements are connected to define a plurality of power-dividing junctions that are located in sequence in at least one radio frequency pathway between the power input and the power output to further divide the radio frequency power in at least one radio frequency pathway, and to connect the radio frequency power further divided from that one pathway with the radio frequency power in another pathway at a power-combining junction in the other pathway, and to provide electrical resistance between the junctions for the further divided power and the adjacent radio frequency pathways.

A two-stage power divider of the invention comprises: a power input, a first power output for a first power pathway, and a second power output for a second power pathway; a first input transmission line coupled to the power input; a first power-dividing stage coupled to the input transmission line and including second and third transmission lines; a second power-dividing stage coupled to the second transmission line and including fourth and fifth transmission lines; a sixth transmission line connected to the fifth transmission line for combining the power from the second power-dividing stage and the third transmission line at a power-combining junction; and a seventh and eighth output transmission line connecting, respectively, the forth transmission line to the first power output and the power-combining junction of the fifth and sixth transmission lines to the second power output.

In preferred embodiments, each of the eight transmission lines comprises a quarter-wavelength transformer uniquely connected to achieve the power division; and the circuit further includes first and second resistors coupled across the outputs of the first and second power-dividing stages, respectively, to provide the circuit with broad bandwidth and high isolation.

With the present invention, power division is dependent only upon the line impedances. Accordingly, the need for close control of gap spacings and line widths, as required in coupled line dividers, is eliminated. The multi-stage design also maintains more practically realizable line impedances than in conventional broad band dividers, and allows for greater power division ratios than can be implemented in a single, resistive, power divider. The power divider circuit of the invention can readily be made with stripline or microstrip construction in a single-layer package.

Further features and advantages of the invention will be set forth hereinafter in conjunction wit the detailed description of a presently preferred embodiment.

DETAILED DESCRIPTION OF THE PREFERRED EMBODIMENT

Figure 1:
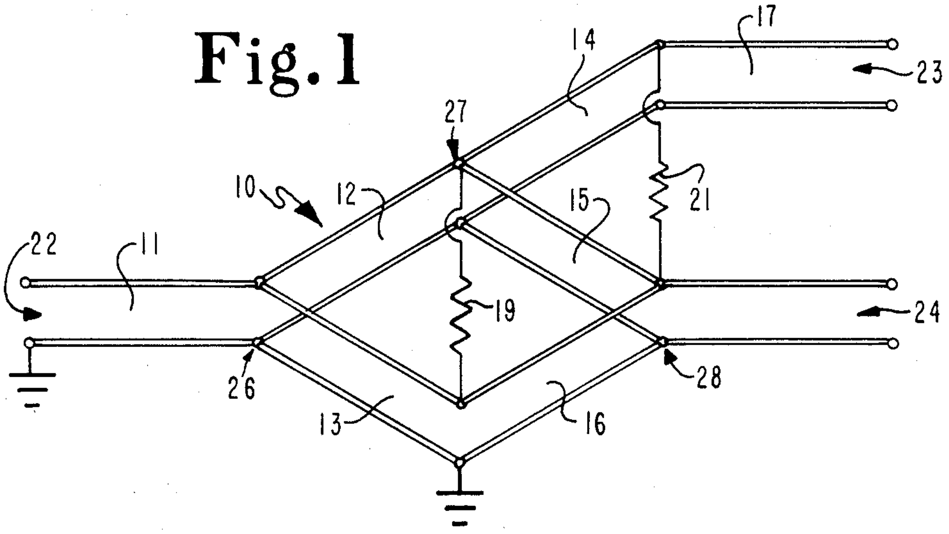
FIG. 1 schematically illustrates a two-stage, resistive power divider according to the invention.

To assist in understanding the invention, FIG. 1 schematically illustrates the invention in a two-stage, resistive, power divider network. The twostage power divider 10 divides the power at power input 22 between two power outputs 23 and 24. The power divider 10 comprises a plurality of passive circuit elements, preferably eight quarter-wavelength transmission line transformers 11-18, and two resistors 19 and 21.

More particularly, transmission line 11 comprises a first impedance-matching transformer connected between the power input 22 and a first power-dividing stage. The first power-dividing stage comprises second and third quarter-wavelength transformers 12 and 13 connected at junction 26, and resistive element 19. The power from the second quarter-wavelength transformer 12 is then further divided in a second power-dividing stage in the first power pathway. The second power-dividing stage comprises fourth and fifth quarter-wavelength transformers 14 and 15 connected at junction 27, and resistive element 21. In the second power pathway, a sixth quarter-wavelength transformer 16 is connected to the three-fourths-wavelength transformer 13, and the fifth quarter-wavelength transformer 15 is connected to the sixth quarter-wavelength transformer 16 to define a power-recombining junction 28 in the second pathway. Quarter-wavelength transformer 17 is connected between the quarter-wavelength transformer 14 and the first power output 23, and an eighth quarter-wavelength transformer 18 is connected to the power-combining junction 28 and the second power output 24. The seventh and eighth quarter-wavelength transformers 17 and 18 comprise impedance-matching transformers between the power divider and the circuitry to which it is connected.

The two resistive elements 19 and 21 are connected across the first and second power-dividing stages and the outputs of the second and third transmission lines 12 and 13, and the fourth and fifth transmission lines 14 and 15, respectively.

The resistance of resistive elements 19 and 21 contribute to broad bandwidth and high isolation. Impedance and resistance values for the elements of circuit 10 are determined by the desired power division, the external characteristic impedance, and the maximum allowed impedance within the power divider. Power division in the circuit is dependent only upon the line impedances; and thus, the need for close control of gap widths, as required in conventional microwave power dividers, is eliminated. The multi-stage design also maintains more practically realizable line impedances than conventional broad band dividers and allows for greater power division ratios than can be implemented in a single, resistive, power divider. The circuit can thus provide reliable power division in the range of 3 dB to 20 dB.

The design equations for the two-stage, resistive power divider of FIG. 1 are set forth below. In the equations, the following definitions apply:

Pd/Pc is the ratio of power at output port 24 divided by the power at power output 23;

$Z_0$ is the characteristic impedance to which the circuit is matched;

$Z_m$ is the maximum allowable impedance to be used in the circuit;

$K^2$ is the ratio of the power in the fourth quarter-wavelength transformer 14 divided by the power in the fifth quarter-wavelength transformer 15, the power division occurring in the second stage of the power divider;

$Z_{01}$–$Z_{08}$ are the line impedances of the transmission line transformers 11–18, respectively; and $R_1$ and $R_2$ are the resistances of resistive elements 19 and 21, respectively.

$$Z_{01} = \left[ \frac{Z_0\, Z_m}{(K(1 + K^2))^{\frac{1}{4}} \sqrt{P_d/P_c - K^2}} \right]^{\frac{1}{2}}$$

$$Z_{02} = \frac{Z_m(1 + P_d/P_c)^{\frac{1}{2}}}{K^{\frac{1}{4}}(1 + K^2)\,(P_d/P_c - K^2)^{\frac{1}{4}}}$$

$$Z_{03} = \frac{Z_m(1 + P_d/P_c)^{\frac{1}{2}}}{K^{\frac{1}{4}}(P_d/P_c - K^2)^{5/4}}$$

$$Z_{04} = Z_m \qquad Z_{05} = Z_m/K^2 \qquad Z_{06} = \frac{Z_m}{P_d/P_c - K^2}$$

$$Z_{07} = \sqrt{Z_m\, Z_0} \left( \frac{K}{1 + K^2} \right)^{\frac{1}{8}}$$

$$Z_{08} = \sqrt{\frac{Z_m\, Z_0}{P_d/P_c}} \left( \frac{K}{1 + K^2} \right)^{\frac{1}{8}}$$

-continued $$R_1 = \frac{Z_m(1 + P_d/P_c)}{K^{\frac{1}{4}}(1 + K^2)^{\frac{3}{4}}\,(P_d/P_c - K^2)}$$

$$R_2 = \frac{Z_m}{K} \left( \frac{1 + K^2}{K} \right)^{\frac{3}{4}}$$

The equations have been prepared, for ease of calculation, on the basis that the power at power output 24 will be greater than the power at power output 23, and that in the second stage of power division $K^2$ will be a fraction.

Figure 2:
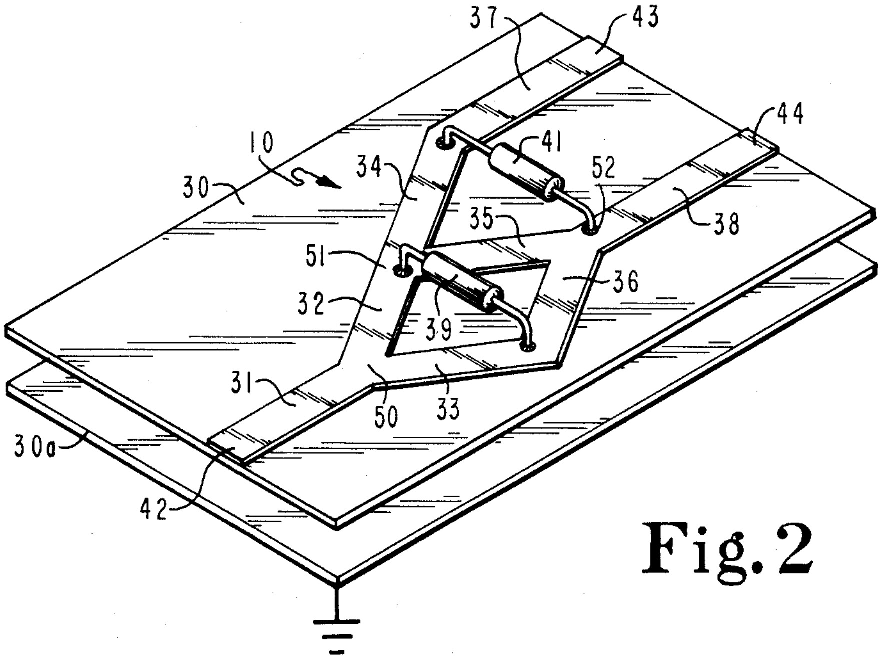
FIG. 2 illustrates the two-stage, resistive, microwave power divider of FIG. 1 implemented as a stripline on a printed circuit board.

FIG. 2 illustrates how simply the power divider 10 of FIG. 1 can be implemented in stripline and microstrip construction. The transmission lines 31–38 correspond, respectively, to the transmission lines 11–18 of FIG. 1. Transmission lines 31–38 can comprise strips of conductive material, preferably copper or gold, on the surface of an electrically non-conductive substrate 30. The substrate 30, in conjunction with an adjacent ground plane **30*a*, forms a power divider 10 of this invention. Transmission lines 32, 34 and 37 form one pathway for radio frequency power from the power input port 42 to the first power output port 43, and transmission lines 33, 36 and 38 form a second radio frequency power pathway from the input power port 42 to the second output power port 44. Transmission line 35 connects the first and second pathways, and power from the first pathway is combined with power from the second pathway at junction 52. Resistors 39 and 41 are connected from the power-dividing junction 51 to the second pathway, and from the power-combining junction 52 to the first pathway, respectively. Resistors 39 and 41 are thus connected across the first power-dividing stage formed by transmission lines 32 and 33 and the second power-dividing stage formed by transmission lines 34 and 35**.

Thus, a multi-stage radio frequency power divider can be formed by providing a non-conductive substrate 30 with a plurality of electrically conductive strip portions 31–38 carried by the substrate. The plurality of conductive strip portions 31–38, in conjunction with an adjacent ground plane, can form a power input port 42, an impedance-matching power input pathway 31 leading to a first power-dividing junction 50, a first radio frequency pathway 32, 34, 37 leading to a first radio frequency power output port 43, and a second radio frequency pathway 33, 36, 38 leading to a second radio frequency power output port 44. The conductive strip portions forming the first pathway 32, 34, 37 lead first to a second power-dividing junction 51, and then from the second power-dividing stage 51 to the first power output port 43. The conductive strip portions 33, 36 forming the second pathway 33, 36, 38 lead to a power-combining junction 52 and the second output port 44. The second power-dividing junction 51 and the power-combining junction 52 are connected by a conductive strip portion 35, and electrical resistance elements 39, 41 are connected from the second power-dividing junction 51 to the second pathway portions 33, 36, and from the power-combining junction 52 to the first pathway portions 34, 37.

The power divider 30 can be conveniently manufactured by conventional printed circuit board and electronic manufacturing techniques without the need for great precision. The dimensions of the conductive strips 31–38 can be determined from the impedances determined from the design equation above by those skilled in stripline and microstrip design techniques.

While what has been described constitutes a presently preferred embodiment, the invention can take various other forms. For example, it should be understood that an input signal appearing at input port 22 can be further divided by multi-staging or the connection of two-stage power dividers to the power outputs 23 and 24. Accordingly, it should be understood that the invention should be limited only insofar as is required by the scope of the following claims.

I claim:

1. A two-stage power divider, comprising:

a power input and first and second power outputs;

a plurality of radio frequency transmission lines connected between the input and the plurality of outputs, said connected radio frequency transmission lines providing a first power-dividing junction to divide power into a first radio frequency pathway to said first power output and a second radio frequency pathway to said second power output, and further providing a second power-dividing junction to divide a portion of the power from the first radio frequency pathway and direct it into a third radio frequency pathway that connects to the second radio frequency pathway at a power-combining junction; and a first resistive element connecting said second power-dividing junction to said second pathway, and a second resistive element connecting said power-combining junction to said first radio frequency pathway.

2. The two-stage power divider of claim 1 wherein said power input is connected to said first power-dividing junction with a first impedance-matching radio frequency transmission line, a second impedance-matching radio frequency transmission line in the first radio frequency pathway connects the power divider to the first power output, and a third impedance-matching radio frequency transmission line connects power-combining junction to the second power output.

3. The two-stage power divider of claim 1 wherein each of the radio frequency transmission lines is a quarter-wavelength transformer.

4. The two-stage power divider of claim 1 wherein a first quarter-wavelength impedance-matching transformer $Z_{01}$ is connected between the power input and the first power-dividing junction; a second quarter-wavelength transformer $Z_{02}$ connects the first power-dividing junction in the first radio frequency pathway to the second power-dividing junction; a fourth quarter-wavelength tranformer $Z_{04}$ and a seventh impedance-matching quarter-wavelength transformer $Z_{07}$ connect said second power-dividing junction to said first power output; a third quarter-wavelength transformer $Z_{03}$ and a sixth quarter-wavelength transformer $Z_{06}$ are connected in the second pathway between the first power-dividing junction and the power-combining junction; a fifth quarter-wavelength transformer $Z_{05}$ is connected between the second power-dividing junction and the power-combining junction; an eighth impedance-matching quarter-wavelength transformer $Z_{08}$ connects the power-combining junction to the second power output; said first resistive element $R_1$ connects the second power-dividing junction to the junction of the third and sixth quarter-wavelength transformers; and said second resistive element $R_2$ connects the junction of the fourth and seventh quarter-wavelength transformers to the power-combining junction.

5. The two-stage power divider of claim 4 wherein the impedances of the plurality of quarter-wavelength transformers and the first and second resistive elements are calculated as follows:

$$Z_{01} = \left[ \frac{Z_0 Z_m}{(K(1+K^2))^{\frac{1}{4}} \sqrt{P_d/P_c - K^2}} \right]^{\frac{1}{2}}$$

$$Z_{02} = \frac{Z_m(1 + P_d/P_c)^{\frac{1}{2}}}{K^{\frac{1}{4}}(1+K^2)(P_d/P_c - K^2)^{\frac{1}{4}}}$$

$$Z_{03} = \frac{Z_m(1 + P_d/P_c)^{\frac{1}{2}}}{K^{\frac{1}{4}}(P_d/P_c - K^2)^{5/4}}$$

$$Z_{04} = Z_m \qquad Z_{05} = Z_m/K^2 \qquad Z_{06} = \frac{Z_m}{P_d/P_c - K^2}$$

$$Z_{07} = \sqrt{Z_m Z_0} \left( \frac{K}{1+K^2} \right)^{\frac{1}{8}}$$

$$Z_{08} = \sqrt{\frac{Z_m Z_0}{P_d/P_c}} \left( \frac{K}{1+K^2} \right)^{\frac{1}{8}}$$

$$R_1 = \frac{Z_m(1 + P_d/P_c)}{K^{\frac{1}{4}}(1+K^2)^{\frac{3}{4}}(P_d/P_c - K^2)}$$

$$R_2 = \frac{Z_m}{K} \left( \frac{1+K^2}{K} \right)^{\frac{3}{4}}$$

where:

$P_d/P_c$ is the ratio of the power at the second power output over the power at the first power output (always greater than 1);

$Z_0$ is the characteristic impedance to which the circuit is matched;

$Z_m$ is the maximum allowable impedance to be used in the circuit;

$K^2$ is the ratio of the power divider in $Z_{05}$ over the power in $Z_{04}$ (always less than 1).

6. In a passive, multi-stage radio frequency power divider, including a power input, a plurality of power outputs and a plurality of passive circuit elements therebetween defining at least two radio frequency pathways and dividing radio frequency power at the power input among the plurality of power outputs, the improvement wherein the plurality of passive circuit elements define a first power-dividing junction and at least one other power-dividing junction located after the first power-dividing junction in one of the radio frequency pathways between the power input and at least one of the power outputs to provide a plurality of divisions of radio frequency power in the one radio frequency power pathway, and wherein the plurality of passive circuit elements further define at least another radio frequency pathway between said first power-dividing junction and at least one other power output including a power-combining junction to recombine the divided radio frequency power from said one radio frequency pathway following its plural division with radio frequency power in said at least another pathway, and wherein electrical resistance is connected between said one radio frequency pathway and said at least another radio frequency pathway between the junctions of the passive circuit elements.

7. A two-stage, power-divider circuit, comprising:

a first input transmission line coupled to an input port;

a first power-dividing stage coupled to said first input transmission line, said first power-dividing stage comprising second and third transmission lines;

a second power-dividing stage coupled to said second transmission line, said second power-dividing stage comprising fourth and fifth transmission lines;

a sixth transmission line connecting the third transmission line with the fifth transmission line at a power-combining junction;

first and second resistances connected across the first and second power-dividing stages, respectively; and seventh and eighth output transmission lines coupled respectively to said fourth transmission line and the junction of the fifth and sixth transmission lines.

8. The power divider of claim 7 wherein each of said eight transmission lines comprises a quarter-wave transmission line transformer.

9. The power divider of claim 8 wherein the impedance of each of said eight transmission lines and the resistances of said first and second resistors are calculated as follows:

$$Z_{01} = \left[ \frac{Z_0 Z_m}{(K(1+K^2))^{1/4} \sqrt{P_d/P_c - K^2}} \right]^{1/2}$$

$$Z_{02} = \frac{Z_m(1 + P_d/P_c)^{1/2}}{K^{1/4}(1+K^2)\,(P_d/P_c - K^2)^{1/4}}$$

$$Z_{03} = \frac{Z_m(1 + P_d/P_c)^{1/2}}{K^{1/4}(P_d/P_c - K^2)^{5/4}}$$

$$Z_{04} = Z_m \qquad Z_{05} = Z_m/K^2 \qquad Z_{06} = \frac{Z_m}{P_d/P_c - K^2}$$

$$Z_{07} = \sqrt{Z_m Z_0}\left(\frac{K}{1+K^2}\right)^{1/8}$$

$$Z_{08} = \sqrt{\frac{Z_m Z_0}{P_d/P_c}}\left(\frac{K}{1+K^2}\right)^{1/8}$$

$$R_1 = \frac{Z_m(1 + P_d/P_c)}{K^{1/4}(1+K^2)^{3/4}\,(P_d/P_c - K^2)}.$$

-continued $$R_2 = \frac{Z_m}{K}\left(\frac{1+K^2}{K}\right)^{3/4}$$

where:

$P_d/P_c$ is the ratio of the power at the second power output over the power at the first power output (always greater than 1);

$Z_0$ is the characteristic impedance to which the circuit is matched;

$Z_m$ is the maximum allowable impedance to be used in the circuit;

$K^2$ is the ratio of the power divider in $Z_{05}$ over the power in $Z_{04}$ (always less than 1).

10. The power divider of claim 9 wherein each of the eight transmission lines and their respective impedances $Z_{01}$–$Z_{08}$ are formed by electrically conductive strip portions carried by an electrically nonconductive substrate and have dimensions to provide the impedances $Z_{01}$–$Z_{08}$, respectively, in the band of frequencies in which the power divider will operate.

11. A multi-stage radio frequency power divider, comprising a nonconductive substrate, a plurality of electrically conductive strip portions carried by the substrate, said plurality of conductive strip portions forming, in conjunction with an adjacent ground plane:

a power input port;

a power input pathway leading to a first power-dividing junction and a first radio frequency pathway leading from the first-power dividing junction to a first radio frequency power output port and a second radio frequency pathway leading from the first power-dividing junction to a second radio frequency power output port;

said first pathway including conductive strip portions leading to a second power-dividing junction and from the second power-dividing junction to the first power output port;

said second pathway including conductive strip portions leading to a power-combining junction and from the power-combining junction to the second output port;

said second power-dividing junction and said power-combining junction being connected by a conductive strip portion; and electrical resistive elements connected from the second power-dividing junction to the second pathway and from the power-combining junction to the first pathway.

* * * * *